United States Patent
van Beers et al.

(10) Patent No.: US 10,871,517 B2
(45) Date of Patent: Dec. 22, 2020

(54) INTEGRATED CIRCUIT ON CHIP INSTRUMENT CONTROLLER

(71) Applicant: NXP B.V., Eindhoven (NL)

(72) Inventors: Johannes Petrus Wilhelmus van Beers, Geldrop (NL); Henricus Hubertus van den Berg, Nijmegen (NL); Richard Morren, Waalre (NL); Joannes Theodorus van der Heiden, Arnhem (NL); Evert-Jan Pol, Eindhoven (NL)

(73) Assignee: NXP B.V., Eindhoven (NL)

( * ) Notice: Subject to any disclaimer, the term of this patent is extended or adjusted under 35 U.S.C. 154(b) by 296 days.

(21) Appl. No.: 15/841,520

(22) Filed: Dec. 14, 2017

(65) Prior Publication Data

US 2018/0172761 A1   Jun. 21, 2018

(30) Foreign Application Priority Data

Dec. 15, 2016   (EP) ..................................... 16204493

(51) Int. Cl.
  *G01R 31/28*   (2006.01)
  *G01R 31/3185*  (2006.01)
  *G01R 31/3187*  (2006.01)
  *G01R 31/319*   (2006.01)
  *G06F 11/27*    (2006.01)

(52) U.S. Cl.
  CPC ..... *G01R 31/2884* (2013.01); *G01R 31/3187* (2013.01); *G01R 31/31915* (2013.01); *G01R 31/318505* (2013.01); *G01R 31/318533* (2013.01); *G06F 11/27* (2013.01)

(58) Field of Classification Search
  CPC .......... G01R 31/2884; G01R 31/31915; G01R 31/318505; G01R 31/3187; G01R 31/318533; G06F 11/27
  USPC ...................................... 324/762.02
  See application file for complete search history.

(56) References Cited

U.S. PATENT DOCUMENTS

| | | |
|---|---|---|
| 2006/0193631 A1* | 8/2006 | Gilligan ................. H04B 10/27 398/58 |
| 2008/0052582 A1 | 2/2008 | Jun et al. |
| 2011/0148456 A1* | 6/2011 | Mooyman-Beck .......................... G01R 31/318513 324/762.02 |
| 2012/0278674 A1 | 11/2012 | Whetsel |
| 2012/0319730 A1* | 12/2012 | Fitton .............. H03K 19/01758 326/41 |

* cited by examiner

*Primary Examiner* — Farhana A Hoque
(74) *Attorney, Agent, or Firm* — Rajeev Madnawat

(57) ABSTRACT

An integrated circuit comprising: a plurality of on-chip-instrument-modules; a test-controller-module configured to communicate data with the plurality of on-chip-instrument-modules; a functional-module configured to communicate data with the plurality of on-chip-instrument-modules; and an on-chip-instrument-controller. The on-chip-instrument controller is configured to: for each of the plurality of on-chip-instrument-modules, store an access-indicator; and based on a value of the access-indicator for each on-chip-instrument-module, enable the on-chip-instrument-module to communicate with either: the test-controller-module; or the functional-module.

13 Claims, 3 Drawing Sheets

INTEGRATED CIRCUIT ON CHIP INSTRUMENT CONTROLLER

CROSS-REFERENCE TO RELATED APPLICATIONS

This application claims the priority under 35 U.S.C. § 119 of European Patent application no. 16204493.7, filed on Dec. 15, 2016, the contents of which are incorporated by reference herein.

The present disclosure relates to integrated circuits, and in particular, although not necessarily, to integrated circuits with on-chip instruments and an on-chip instrument controller.

According to a first aspect of the present disclosure there is provided an integrated circuit comprising:
  a plurality of on-chip-instrument-modules;
  a test-controller-module configured to communicate data with the plurality of on-chip-instrument-modules;
  a functional-module configured to communicate data with the plurality of on-chip-instrument-modules; and
  an on-chip-instrument-controller configured to:
    for each of the plurality of on-chip-instrument-modules, store an access-indicator; and
    based on a value of the access-indicator for each on-chip-instrument-module, enable the on-chip-instrument-module to communicate with either:
      the test-controller-module; or
      the functional-module.

In one or more embodiments the integrated circuit may further comprise a test-interface-port configured to communicate data with the test-controller-module to set individual values of the access-indicator for each on-chip-instrument-module.

In one or more embodiments the on-chip-instrument-controller may be configured to set a particular access-indicator value to enable communications between the test-controller-module and a particular on-chip-instrument-module in response to test-instructions received at the test-interface-port.

In one or more embodiments the on-chip-instrument-controller may be configured to set the particular access-indicator value to enable communications between the functional-module and the particular on-chip-instrument-module in response to reset-instructions received at the test-interface-port.

In one or more embodiments the on-chip-instrument-controller may be configured, by instructions received at the test-interface-port, to control the functional-module.

In one or more embodiments the functional-module may be controlled to send instruction-data to one of the plurality of on-chip-instrument-modules. The on-chip-instrument-controller may be configured to communicate built-in-self-test-data, representative of a response of the one of the plurality of on-chip-instrument-modules to the instruction-data, to the test-interface-port.

In one or more embodiments the on-chip-instrument-controller may be configured at start-up to set the value of each access-indicator to enable communication between the functional-module and each on-chip-instrument-module.

In one or more embodiments the on-chip-instrument-controller may comprise a transceiver and an instrument-data-register. The transceiver may be configured to communicate data between: i) the test-controller-module and/or the functional-module; and ii) the instrument-data-register. The instrument-data-register may be configured to communicate data with each of the plurality of on-chip-instrument-modules.

In one or more embodiments the transceiver may comprise: a serializer, configured to receive parallel-request-data from the functional-module and to provide serial-request-data, representative of the parallel-request-data, to one or more of the plurality of on-chip-instrument-modules. The transceiver may comprise a deserializer, configured: to receive serial-response-data from the one or more of the plurality of on-chip-instrument-modules in response to the serial-request-data; and to provide parallel-response-data, representative of the serial-response-data, to the functional-module.

In one or more embodiments the instrument-data-register may comprise: a control-multiplexer; and a control-deserializer, configured to receive serial-request-data from the test-controller-module and to communicate parallel-request-data, representative of the received serial-request-data, to the control-multiplexer. The control-multiplexer may be configured to multiplex parallel-request-data to an on-chip-instrument-module and from either: i) the control-deserializer; or ii) the functional-module, based on the value of the access-indicator for the on-chip-instrument-module.

In one or more embodiments the instrument-data-register may further comprise: an observe-multiplexer configured: to receive parallel-response-data from the on-chip-instrument-module in response to the parallel-request-data; and to multiplex the parallel-response-data to either:
  i) the functional-module; or ii) an observe-serializer, based on the value of the access-indicator for the on-chip-instrument-module. The observe-serializer may be configured to communicate serial-response-data, representative of the parallel-response-data, to the test-controller-module.

In one or more embodiments one or more of the plurality of on-chip-instrument-modules may be a sensor.

In one or more embodiments the sensor may be configured to sense one or more of: one or more temperatures; one or more frequencies; one or more time intervals; one or more voltages; one or more currents; one or more signal amplitudes; or one or more signal power values.

In one or more embodiments one or more of the plurality of on-chip-instrument-modules may be a signal generator.

In one or more embodiments the signal generator may be one or more of: an RF oscillator; an IF oscillator; a bias generator; a controllable power supply; a noise generator; an auxiliary Digital-to-Analogue convertor.

In one or more embodiments one or more of the plurality of on-chip-instrument-modules may be a signal processing module.

In one or more embodiments the signal processing module may be one or more of: a controllable amplifier; a linear filter; a non-linear filter; a mixer; a distortion inserter; a peak detector; a correlation engine; or a Fourier transformer.

In one or more embodiments one or more of the plurality of on-chip-instrument-modules may be configured to communicate with an external-component coupled to the integrated circuit.

In one or more embodiments the external-component may be an antenna.

In one or more embodiments there may be provided an automotive radio apparatus comprising any integrated circuit disclosed herein.

In one or more embodiments there may be provided an electronic device comprising any integrated circuit disclosed herein.

While the disclosure is amenable to various modifications and alternative forms, specifics thereof have been shown by way of example in the drawings and will be described in detail.

It should be understood, however, that other embodiments, beyond the particular embodiments described, are possible as well. All modifications, equivalents, and alternative embodiments falling within the spirit and scope of the appended claims are covered as well.

The above discussion is not intended to represent every example embodiment or every implementation within the scope of the current or future Claim sets. The figures and Detailed Description that follow also exemplify various example embodiments. Various example embodiments may be more completely understood in consideration of the following Detailed Description in connection with the accompanying Drawings.

One or more embodiments will now be described by way of example only with reference to the accompanying drawings in which.

Instruments are entities in a production test system that may provide signal generation, signal processing, and/or signal measurement. In a conventional production environment or validation test system, instruments are typically connected to the Integrated Circuit (IC) pins externally. New generation ICs may benefit from integration of instruments for production testing, and/or for applications such as diagnostic testing, for several reasons. Firstly, external tester instruments may lack the accuracy or sensitivity that is required to measure ICs high performance parameters. Secondly, test cost may be reduced by avoiding expensive high performance tester options and enabling multi-site testing. Thirdly, on-chip test data generation and data reduction may reduce test time. Fourthly, test time may be reduced by executing fully on-chip tests in parallel. Additionally, it may be possible to use the same on-chip instruments to test an IC in end-of-line production to check the performance of the system. It may also be possible to check interfaces, such as to a circuit board on which the IC is mounted, or to other components (like antenna connections, for example) before releasing a final product, to ensure the final product can perform as desired.

When an instrument is provided as an integral part of an integrated circuit it may be described as an on-chip-instrument-module. An on-chip-instrument-module may comprise a sensor, for example. Such a sensor may be configured to sense one or more of a temperature, a frequency, a time interval, a voltage or a current.

In an IC there are blocks that require functional access and test access. Besides these blocks also instruments are integrated that require test access and possibly functional access. The functional design specification is, conventionally, in a mature state when the Design for Test (DfT) specification starts. Both functional and test access have their own specific requirements. For this reason a strict separation between functional or test access is conventionally implemented. An optimal solution for implementing the requirements of both test and functional systems is not achieved. Not all test resources are by default accessible by the functional system or vice versa. An IEEE1149.1 Joint Test Action Group (JTAG) interface commonly controls the test access.

Another problem is that in functional DfT solutions either functional system or the test system has control over all the blocks that are shared. However, there are test and functional use cases, including for example functional validation, applications and diagnostic uses, that may require a mix of blocks under test and functional control.

Figure 1:
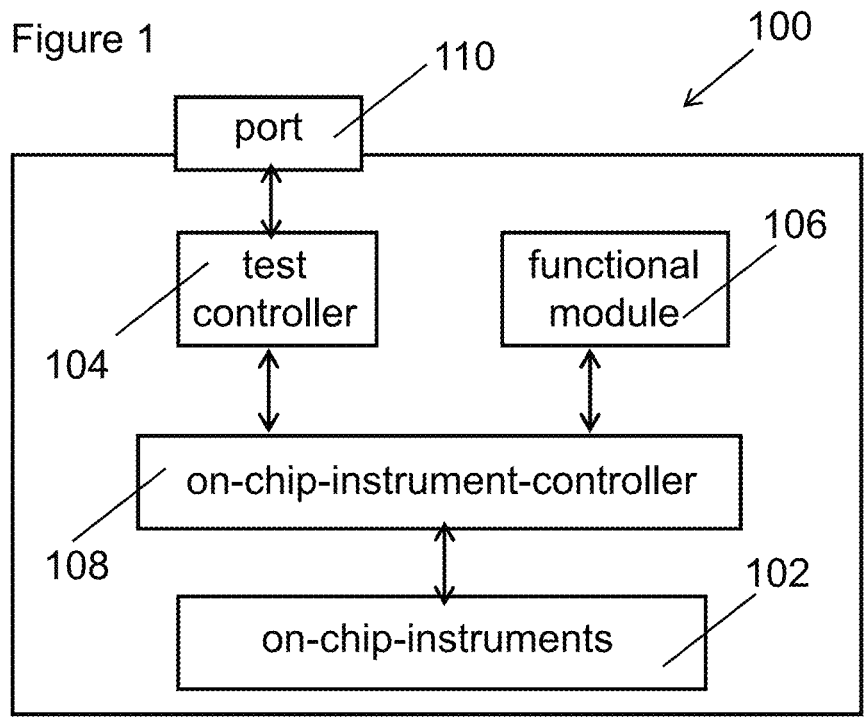
FIG. 1 shows a schematic block diagram of an example embodiment of an integrated circuit with on-chip instruments and an on-chip instrument controller.

FIG. 1 shows a schematic block diagram of an integrated circuit 100. The integrated circuit 100 has a plurality of on-chip-instrument-modules 102 and a test-controller-module 104 configured to communicate data with the plurality of on-chip-instrument-modules 102. The test-controller-module 104 may send data to any of the plurality of on-chip-instrument-modules 102 and/or may receive data from any of the plurality of on-chip-instrument-modules 102.

The integrated circuit 100 also has a functional-module 106 configured to communicate data with the plurality of on-chip-instrument-modules 102. It will be appreciated that integrated circuits according to the present disclosure may comprise a plurality of functional-modules, such as data-processors or memories.

Both the functional-module 106 and the test-controller-module 104 are configured to communicate data with the on-chip-instrument-modules 102 via an on-chip-instrument-controller 108. The on-chip-instrument-controller 108 functions to control access to the on-chip-instrument-modules 102 by either the test-controller-module 104 or the functional-module 106. Each one of the plurality of on-chip-instrument-modules 102 may be accessed individually by either the test-controller-module 104 or the functional-module 106. To achieve this, for each of the plurality of on-chip-instrument-modules 102 the on-chip-instrument-controller 108 stores an access-indicator. Based on a value of the access-indicator for each particular on-chip-instrument-module 102, the on-chip-instrument-controller 108 enables that particular on-chip-instrument-module 102 to communicate with either the test-controller-module 104 or the functional-module 106. In some examples, the access-indicator may be a single binary digit.

In this example, the integrated circuit 100 also has a test-interface-port 110 coupled to the test-controller-module 104. The test-interface-port 110 may be used to provide data, such as instructions, to the test-controller-module 104 and to receive data, such as test results, from the test-controller-module. The test-interface-port 110 may receive data that is used to set individual values of the access-indicator for each on-chip-instrument-module 102.

Based on data, which may be described as test-instructions, received from the test-interface-port 110, the on-chip-instrument-controller 108 can be configured to set a particular access-indicator value to enable communications between the test-controller-module 104 and a particular on-chip-instrument-module. Similarly, the on-chip-instrument-controller 104 can be configured to set the particular access-indicator value to enable communications between the functional-module 106 and the particular on-chip-instrument-module, in response to reset-instructions received at the test-interface-port 110. In this way, any subset of the on-chip-instrument-modules 102 can be configured to communicate with the functional-module 106 or with the test-controller-module 104; each on-chip-instrument-module can be configured independently of other on-chip-instrument-modules.

The on-chip-instrument-controller 108 may also be described as an on-chip-instrument infrastructure (OCII), which integrates the conventional instruments, controllers, and switches to connect signals to instruments, and functional blocks that require both test and functional control. All of these blocks may be considered as OCII on-chip instruments. The OCII advantageously provides standardized access to on-chip instruments and shared functional resources, or functional blocks, for both functional and test use cases.

Figure 2:
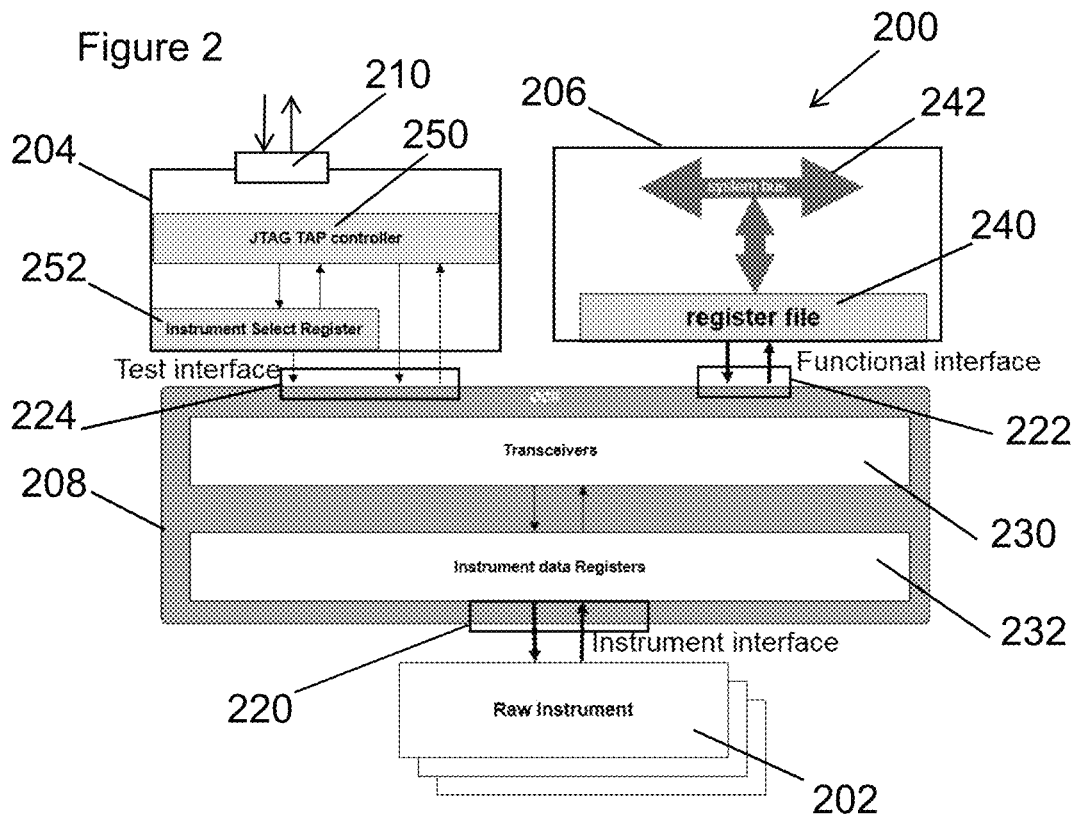
FIG. 2 shows a schematic block diagram of an example embodiment of an integrated circuit similar to that of FIG. 1.

FIG. 2 shows a schematic block diagram of an integrated circuit 200 that is similar to the integrated circuit of FIG. 1, and similar features have been given similar reference numerals and may not necessarily be described further here.

The OCII 208 has three interfaces: an instrument interface 220, a functional interface 222 and a test interface 224. The test interface 224 provides master instrument access. The test interface 224 can be fully under the control of a production tester, which can be a test requirement. The functional or test access can be controlled per instrument. This enables use cases with a mix of instruments under test or functional control. The shared functional/test access enables usage of the instruments in functional applications, in-system diagnosis and functional system validation, Built-In Self-Test (BIST) for production test and IEEE1687 internal Joint Test Action Group (IJTAG) compliant test access.

The OCII 208 is coupled, by the instrument interface 220, to a plurality of on-chip-instruments 202, which may also be described as Raw instruments. Raw instruments can include test modules, which may comprise analogue functional blocks and/or digital functional blocks. The OCII 208 translates between (i) the instrument interface 220 on one side and (ii) the functional interface 222 and the test interface 224 on the other side. The OCII 208 consists of Transceivers 230 and Instrument Data Registers 232, in this example. The transceivers 230 may configure instrument data register access, which may be configured for either functional access or test access. To select between functional access or test access for each Raw Instrument 202, the transceiver 230 is configured to store the access-indicator for each Raw Instrument 202. The transceiver 230 can also control the data transfer with the Raw Instruments 202. The Instrument Data Registers 232 may perform serial to parallel data conversion. Typically, data provided to the test interface 224, from the test-controller-module 204, will be in serial form, while in some examples the Raw Instruments 202 will communicate in parallel form.

In some examples, a system power up sequence enables the functional access paths of all registers. Thereby, the default setting enables communication between the functional block 206 and all of the Raw instruments 202. The functional block 206 in this example comprises a functional register file 240 which is coupled to a system bus 242. The system bus 242 may provide the functional block 206 with access to additional functional resources (not shown). The data path between the functional register file 240 and the Raw instruments 202 is transparent in this mode. Both: (i) the functional interface 222, between the functional register file 240 and the OCII 208; and (ii) the instrument interface 220 between the OCII 208 and the Raw instruments 202 are identical in this example, and are configured to communicate data in a parallel form.

The test-controller-module 204 comprises a test access port (TAP) controller 250 and an instrument select register 252. The test access port controller 250 can provide the test interface 224 with data that enables control of a specific Raw instrument by the test access port controller 250. The test access port controller 250 programs the Instrument select register 252 to select a Raw Instrument for test control. The data path from test access port controller 250 to the OCII 208 is serial. The Instrument Data Registers 232 will perform a serial to parallel conversion because the interface with the Raw instrument requires parallel communication, in this example.

The OCII 208 can advantageously provide a standard interface to Raw instruments 202 that are shared between production test and functional modes. Raw instruments 202 can be accessed via the test access port controller 250 while the functional system is active, if the function is not disturbed by the test access, such as when a particular instrument is not required by the functional system.

Functional system validation can use this capability to validate the system design. Raw Instruments may be configured to make frequency measurements, Direct Current (DC) measurements and/or temperature measurements. In-system diagnosis can be performed if on-chip processors have access to the Raw instruments. These processors can execute diagnosis software to evaluate the system performance or even connections outside the IC itself. Connections outside of the IC may include antenna connections, for example. The same mechanism can be used to implement a Built-in Self Test for production testing, where test support software is executed on a functional processor, such as the functional-module 206. The functional-module 206 is connected to the OCII 208 to give the test-controller-module 204 control over the functional-module 206. The OCII 208 may thereby be configured, by instructions received at the test-interface-port 210, to control the functional-module 206. The functional-module 206 may be controlled to send instruction-data to one of the plurality of Raw Instruments 202. The OCII 208 may then communicate built-in-self-test-data, representative of a response of the one of the plurality of Raw Instruments 202 to the instruction-data, to the test-interface-port 210. The data provided by the Raw Instrument 202 may be processed by the functional-module 206 in order to provide the built-in-self-test-data, or alternatively, the data provided by the Raw Instrument 202 may be sent directly to the test-interface-port 210. In that case layering in OCII 208 is implemented: one master instrument controls multiple slave instruments over the functional path of OCII. A master instrument is an example of a functional module 206. In a layered system, a master instrument generates data that may be sent to one or more slave instruments to synchronize the operation of those slave instruments. The slave instruments may then send response data back to the master instrument for processing before an output is provided to, for example, the test-interface-port 210.

A parallel or serial option can be available for functional data transfer to and from the instrument data register 232 of the OCII 208. These two options will discussed below with reference to FIGS. 3 to 6.

Figure 3:
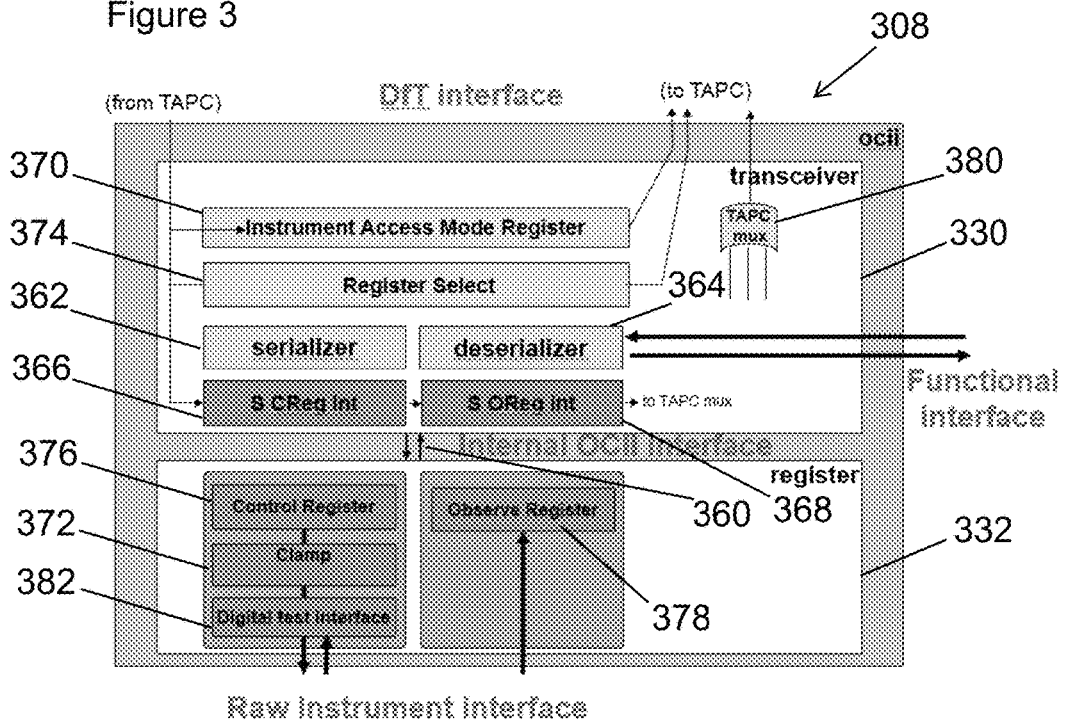
FIG. 3 shows a schematic block diagram of an example embodiment of an integrated circuit for controlling serial on-chip instruments.

FIG. 3 shows an OCII 308 configured to provide serial access to the Raw Instruments (not shown). This can be useful for applications where the data transfer is not timing critical. In that case a low number of connections between the transceiver 330 and the instrument data register 332 can be achieved. This option can be chosen when static control signals cross the internal OCII interface 360 between the transceiver 330 and the instrument data register 332. In this case, the serial functional access option reduces the number of signals crossing the internal OCII interface 360 significantly and thereby reduces interference risks for Radio Frequency (RF) applications. Additionally, deployment of the serial option may reduce chip area when the OCII bridges the analogue and digital domains in a mixed-signal design: by reducing the number of signals crossing the internal OCII interface, the number of associated level translator cells and isolation cells is likewise reduced.

The transceiver 330 comprises a serializer 362 and a de-serializer 364 in the functional data path. The serializer 362 converts parallel data from the functional-module into serial form for the Raw Instruments. The de-serializer 364 receives serial data from the Raw Instruments and converts it into parallel form for communicating back to the functional-module. The serializer 362, is configured to receive parallel-request-data from the functional-module and to provide serial-request-data, representative of the parallel-request-data, to one or more of the plurality of Raw Instruments. The deserializer 364 is configured to receive serial-response-data from the one or more of the plurality of Raw Instruments in response to the serial-request-data and to provide parallel-response-data, representative of the serial-response-data, to the functional-module.

The transceiver 330 also includes CReg Int 366 and OReg Int 368 blocks and an Instrument Access mode register 370. The CReg Int 366 and OReg Int 368 blocks can take care of multiplexing between test and functional data and control paths, as described further below in relation to FIG. 4.

The Instrument Access Mode register 370 controls the configuration of the system by storing an access-indicator value for each Raw Instrument.

The Instrument Access Mode Register 370 is reset at power-up, which causes the access-indicator values to be set such that the OCII 308 puts the Raw Instruments in communication with the functional module. In this way, the OCII 308 selects the functional data path to the Raw Instruments.

The instrument access mode register 370, in this example, is also configured to activate a clamp block 372 in the instrument data register 332. The clamp block 372 can protect the Raw instruments from destructive settings.

In some examples, there may be three levels of clamp defined in the following order of priority. First, there may be an optional Scan clamp. A Scan clamp can define a safe state per signal in the interface. A safe value may be defined during a structural scan test mode to protect the raw instrument from unsafe conditions. This may be provided during a structural test of digital logic, for example. Second, there may be an optional Idle clamp. An Idle clamp may define a default mode during test access of a raw instrument (and thereby provide a Reset state for test). Third, there may be an optional Functional clamp. A Functional clamp may, by default, be active during a device power up condition. A Functional clamp may define a state during the power-up and boot sequence that is controlled by the functional system.

A Register Select block 374 selects either a control register 376 (for storing data that is to be written to the Raw Instrument) or an observe register 378 (for storing data that has been read from the Raw Instrument) for direct access in the test access path. This provides a short access path to and from the registers with an efficient protocol, which may advantageously reduce test time for production testing. The access path can be short because the IC can have device pins, an input pin (TDI) and an output pin (TDO) that are directly connected to the input and output of the selected data shift registers. This provides for an advantageously short data path.

The selected register will change content and all other registers will hold their content in test access mode. Either of the data control or observe register can be selected. There may be only one register selected for access via TDI and TDO.

A block 380 connects the serial outputs of the observe register 378 to the test-controller-module via the S OREG Int 368 blocks. The block 380 may be implemented with an OR-gate. The shift outputs of non-selected registers may be set to logic 0. Thereby, only the selected register can pass the actual logic value to the output of the OR-gate (block 380) that is connected to TDO on an IC level pin.

The instrument data register 332 configures:
the data path selection, which connects either (i) the test interface (connected to test-controller-module) to a Raw instrument or (ii) the functional interface to a Raw instrument; (The data path selection occurs in the CReg 366 and OReg 368 interfaces. The data registers itself contain the data, which controls the interface of the Raw instrument. The data is either received from the Test interface or the functional interface depending on the configuration of the Instrument Access Mode register 370.)
enables or disables the Clamp function in the instrument data register 332.

The instrument-data-register 332 also comprises an optional digital test interface block 382. The digital test interface block 382 is configured to perform monitoring of IO lines and correct isolation during structural scan test. Signals crossing the Raw instrument interface have may have a "loop-back" to the OCII interface. This enables testing of the connections of the control signals of the interface for the purpose of detecting defects inside a reception point of the raw instrument. This can be done during a regular scan test of digital logic. During this scan test mode, the IC is in a special test mode to check digital logic components for possible manufacturing defects. An XOR daisy chain may be used to compare outgoing and incoming signals in order to detect defects.

Figure 4:
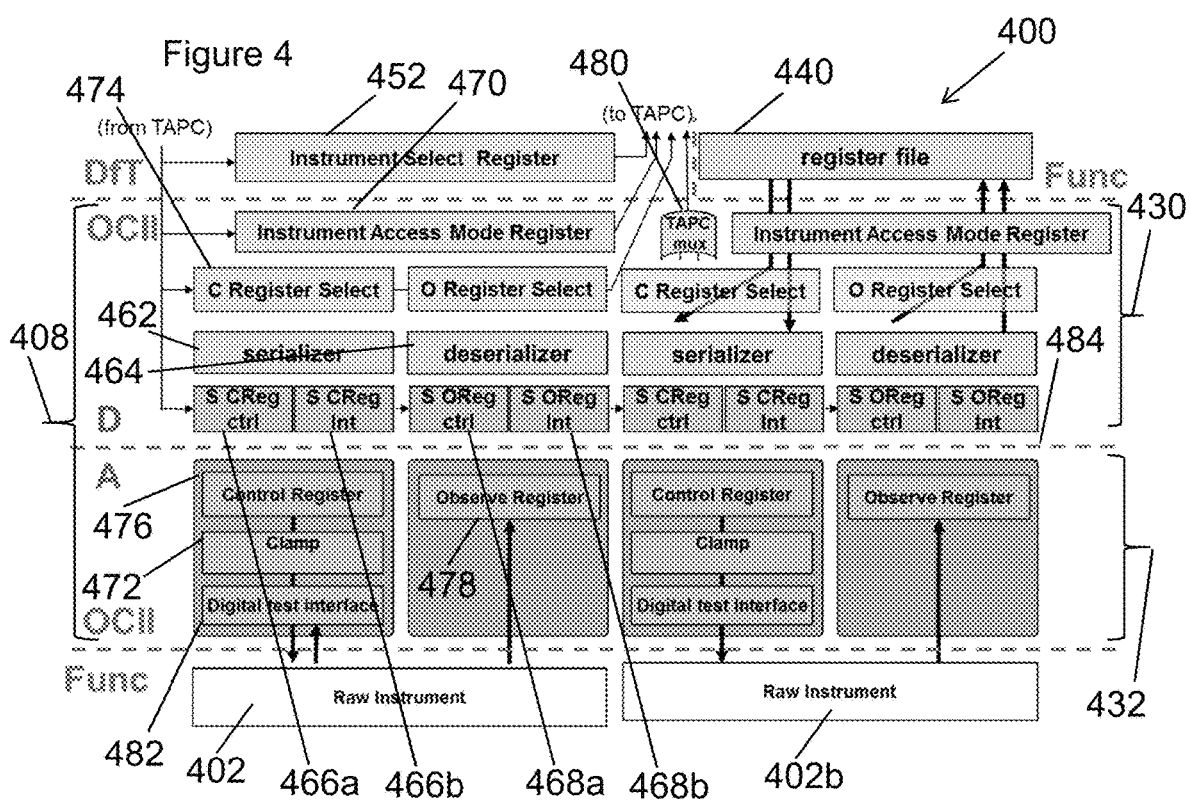
FIG. 4 shows a schematic block diagram of an example embodiment of an integrated circuit similar to that of FIG. 3.

FIG. 4 shows a schematic block diagram of an integrated circuit 400 similar to those shown in FIGS. 2 and 3. Similar features have been given similar reference numerals and may not necessarily by discussed further here.

The integrated circuit 400 of FIG. 4 comprises an on-chip-instrument-controller 408 and analogue raw instruments 402, 402b. In this example, first 402 and second 402b analogue Raw Instruments are shown, although it will be appreciated that a plurality of Raw Instruments, greater in number than two, may alternatively be provided.

The first and second Raw Instruments 402, 402b are both configured to communicate with either a register file 440 of a functional-module or a test-controller-module (identified as TAPC in the figure) in the manner already discussed above in relation to FIGS. 2 and 3. Separate components of the transceiver 430 and the instrument data register 432 in FIG. 4 are provided for each of the first and second Raw Instruments 402, 402b. The components for each raw instrument correspond to those illustrated for the single raw instrument of FIG. 3, and will therefore not be discussed further here.

It will be appreciated that any number of Raw Instruments may be provided, and that the associated components of the transceiver 430 and instrument data register 432 may be replicated a corresponding number of times such that a set of such components is provided for each Raw Instrument.

The integrated circuit 400 has a Serial Control Register (S CReg) that comprises two blocks: a Serial Control Register control (S CReg ctrl) block 466a and a Serial Control Register interface (S CReg int) block 466b.

The S CReg ctrl block 466a provides for:
interfacing between a test access port controller (TAPC) and the instrument data register 432; and
multiplexing between the instrument data register 432 and either (i) the test-controller-module (for test control access), or (ii) the functional-module (for functional control access).

The S CReg int block 466b provides for interfacing between the instrument data register 432 and the TAPC, and in particular:
multiplexing data between the instrument data register 432 and either (i) the test-controller-module (for test data), or (ii) the functional-module (for functional data);
multiplexing clock signals between the instrument data register 432 and either (i) the test-controller-module, or (ii) the functional-module.

The integrated circuit 400 has a Serial Observe Register (S OReg) that comprises two blocks: a Serial Observe Register control (S OReg ctrl) block 468a and a Serial Observe Register interface (S OReg int) block 468b.

The S OReg ctrl block 468a provides multiplexing in the control path from the instrument data register 432 to either (i) the TAPC (for test mode), or (ii) the functional-module (for functional mode).

The S OReg int block 468b provides: multiplexing in the data path from the instrument data register 432 to either (i) the TAPC (for test mode), or (ii) the functional-module (for functional mode).

It will be appreciated that, while the S CReg ctrl block 466a is shown as separate from the S CReg int block 466b, the functionality of these two blocks could be provided by a single block, such as a combined S CReg block (not shown). Similarly, it will be appreciated that, while the S OReg ctrl block 468a is shown as separate from the S OReg int block 468b, the functionality of these two blocks could be provided by a single block, such as a combined S OReg block (not shown).

In the example shown in FIG. 4, the on-chip-instrument-controller 408 comprises an instrument data register 432 that is analogue and a transceiver 430 that is digital. The analogue and digital components are shown on separate sides of a dotted line 484. It will be appreciated that any convenient system for digital-to-analogue and analogue-to-digital conversion may be used to enable the transceiver 430 to communicate with the instrument data register 432.

Figure 5:
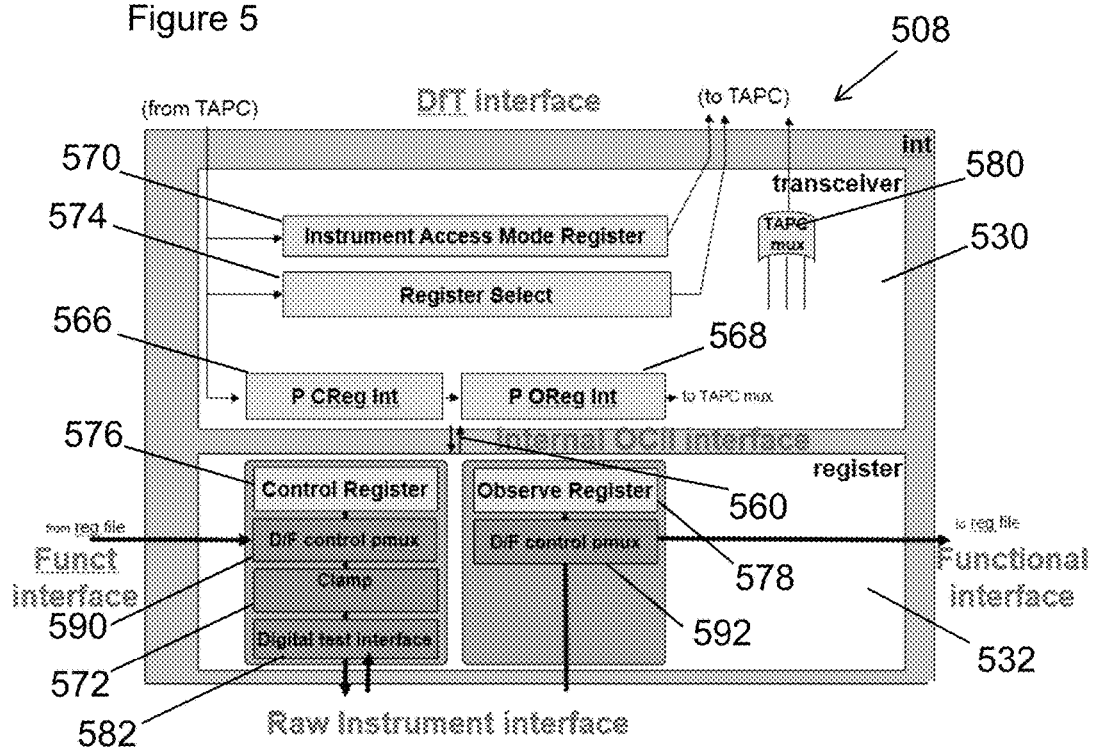
FIG. 5 shows a schematic block diagram of an example embodiment of an integrated circuit for controlling parallel on-chip instruments.

FIG. 5 shows an OCII 508 configured to provide parallel functional access to the Raw Instruments (not shown). Features that are similar to those of earlier figures have been given similar reference numerals and may not necessarily be discussed further here.

Parallel functional access can be useful for applications where the data transfer is timing critical. The number of connections in the functional interface is larger and therefore less efficient, in terms of area, because the data busses may be physically wider, than in the serial option of FIG. 3. Such wider busses may require a greater area of Silicon to implement, which may also render the system more sensitive to production defects, such as defects in the silicon. Parallel functional access can be chosen when dynamic control signals cross Digital to Analogue interfaces (which in this example is the internal OCII interface 560). Since the functional data transfer is parallel no serializer or de-serializer are required in the functional path, in this example.

The instrument data register block 532 of the OCII 508 contains a control register 576 and an observe register 578 for each of the Raw instruments. The function of the control register 576 is serial to parallel data conversion. The control register 576 is an example of a control-deserializer, which may be configured to receive serial-request-data from the test-controller-module and to communicate parallel-request-data, representative of the received serial-request-data, to the Raw instrument. In this example, the serial-request-data is provided to the Raw instrument via a control-multiplexer 590, which can enable the Raw instrument to be used for either functional access or test access, as discussed below.

Data communicated between the test-controller-module and the Raw instrument will be in serial form, hence the need to convert between serial and parallel to enable communication between the test-controller-module and the Raw instruments. In this example, of parallel functional access, the control register 576 and the observer register 578 are used for the test data transfer and not for the functional data transfer. The functional data is already in parallel form and can therefore be communicated directly with the control-multiplexer 590 without requiring any serial to parallel conversion.

Based on the value of the relevant access-indicator, the control-multiplexer 590 will communicate either the functional data or the test data to the relevant Raw instrument. An observe multiplexer 592 will communicate data from the Raw instrument to either the functional-module, when in functional mode, or to the observe register 578, when in test mode, based on the value of the relevant access-indicator. The observe register 578 is an example of an observe-serializer. The observe register 578 is configured to receive parallel response data from a Raw Instrument and to communicate serial response data, representative of the parallel response data, to the test-controller-module (not shown) via the block 580. In this way, serial data is communicated to the test-controller-module, that is representative of the parallel data provided by the Raw Instrument.

The Clamp block 572 may control the Raw instrument interface into a defined state. This may occur during a power-up of the system, controlling the instruments in an idle mode or in a safe condition during a structural scan test. The OCII 508 includes the Design for Test functionality to guarantee high structural production test coverage. During a structural scan test the system is in a special test mode. During this scan test mode all digital logic may be tested for manufacturing defects. In this scan test mode the IC and its components, such as the on-chip instruments, are not functional. The structural test is taken into account while designing the IC implementation. After the structural scan test is performed, the digital logic including the OCII is thereby well characterised up to and including the boundary of the analogue RAW instruments. After this structural test the OCII is verified/calibrated and can therefore be used as an instrument for test purposes.

Figure 6:
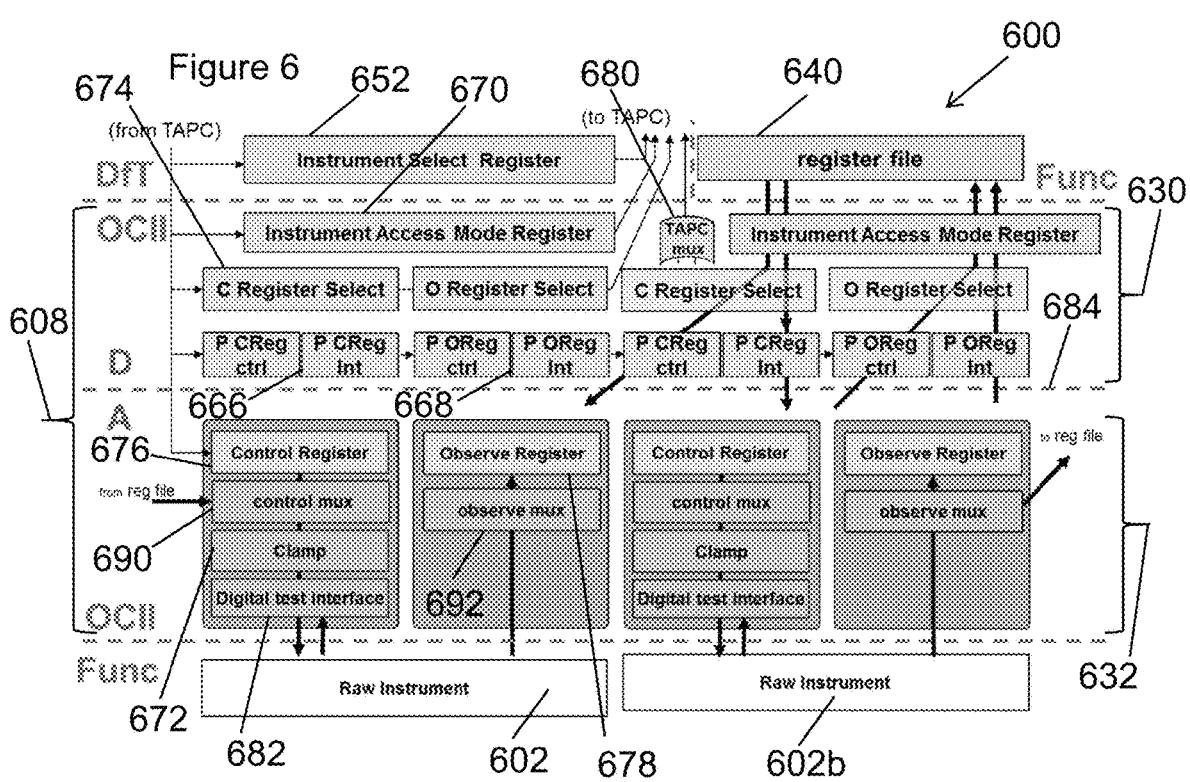
FIG. 6 shows a schematic block diagram of an example embodiment of an integrated circuit similar to that of FIG. 5.

FIG. 6 shows a schematic block diagram of an integrated circuit 600 similar to those shown in earlier figures. Similar features have been given similar reference numerals and may not necessarily by discussed further here.

As in the example of FIG. 4, the integrated circuit 600 comprises both a first Raw Instrument 602 and a second Raw Instrument 602b. Again, as in the example of FIG. 4, the integrated circuit 600 has a set of components in an on-chip-instrument-controller 608 that are each configured to provide for communications between each of the Raw Instruments 602, 602b and the instrument select register 652 of the test-controller-module or the register file 640 of the functional-module.

In this example, both the first raw instrument 602 and the second raw instrument 602b are examples of analogue Raw Instruments. In this example, the on-chip-instrument-controller 608 comprises an analogue instrument data register 632 and a digital transceiver 630. The analogue and digital components are shown on separate sides of a dotted line 684. It will be appreciated that any convenient system for digital-to-analogue and analogue-to-digital conversion may be used to enable the transceiver 630 to communicate with the instrument data register 632. It will also be appreciated that in other examples, digital raw instruments may be used instead of analogue Raw Instruments, in which case digital-to-analogue and analogue-to-digital conversion will not be required.

Generally, the instrument register data and register test access protocols are separated. The instrument register data is content of the register that controls the Raw instrument or represents the response from the Raw instrument. The register test access protocol describes how to transport the data via the OCII. The instrument register data is the variable part, the protocol is constant for a given register. By separating the data and the protocol it is possible to enable re-use of the protocol independent from the register content. The access protocols are IC specific and the OCII standardization enables automatic generation of these protocols. The register data may be re-used if on-chip instruments are re-used between separate IC projects or if multiple similar instruments are used in one IC.

The standard OCII reduces therefore test development effort for the production test. The same register data can be used for functional validation, which uses the functional access path. Functional validation is a design task, which validates that functions are correctly implemented on Silicon according to design and system specifications. This may include a complete system on chip functional validation including a validation of the Raw instrument functions.

The integrated circuits shown in FIGS. 1 to 6 can enable instruments to be shared between functional and test use cases in order to advantageously reduce silicon cost. An improved solution for sharing instrument resources between functional design and test design can be implemented if functional design and DfT specification is integrated from the start of the design process. The OCII enforces and supports this way of working. The OCII enables standard functional and test access combinations of on-chip instruments.

This can be in contrast to an IC design that starts with the functional design specification, which determines the structure and function of the functional-modules, and then subsequently develops the Design for Test (DfT) specification. In such cases, the Design for Test specification may be determined as an incremental step once the functional design specification is already in a mature state. This approach, of separating the development of the functional and test specifications may consequently fail to provide the advantages associate with the IC's illustrated in FIGS. 1 to 6, which can independently configure access to individual raw instruments for either test or functional purposes.

The OCII designs disclosed herein enable further production test time improvement optimizations and functional features. For example, a Built-In Self Test (BIST) can be implemented using functional IC resources like processors to control a sequence of measurements. Test time may be reduced by executing fully on-chip tests in parallel using the BISTs. Such parallel processing may not be possible with conventional test systems, as such test system generally use serial communications protocols.

Instrument availability during functional usage of an integrated circuit may have various benefits. A self-contained system running Built-In Self Tests after silicon release and shipment to a customer may enable the customer to verify if parts are correct and according their expectations. Customers can use the Built-In Self Tests to perform board and product tests, including connectivity tests from external components towards the IC (like antenna connections and cabling, for example). This will save expensive testing by hand, production cost, and production time for manufacturers.

Embodiments of this disclosure may be used in a car radio apparatus to enable all functional and test applications supported by this disclosure. The disclosure is not limited to car radio applications and can be used in any application that requires sharing of functional and test resources.

The instrument access protocols will be used on the standard production testers. The instrument control data can be inserted real time on the tester, without changing the protocols. Test engineers only need to apply the data to be sent to the register without detailed knowledge of the access protocols. The data can be programmed dynamically via high level standard application programming interfaces (APIs). The protocols are embedded in the APIs.

The instructions and/or flowchart steps in the above figures can be executed in any order, unless a specific order is explicitly stated. Also, those skilled in the art will recognize that while one example set of instructions/method has been discussed, the material in this specification can be combined in a variety of ways to yield other examples as well, and are to be understood within a context provided by this detailed description.

In some example embodiments the set of instructions/method steps described above are implemented as functional and software instructions embodied as a set of executable instructions which are effected on a computer or machine which is programmed with and controlled by said executable instructions. Such instructions are loaded for execution on a processor (such as one or more CPUs). The term processor includes microprocessors, microcontrollers, processor modules or subsystems (including one or more microprocessors or microcontrollers), or other control or computing devices. A processor can refer to a single component or to plural components.

In other examples, the set of instructions/methods illustrated herein and data and instructions associated therewith are stored in respective storage devices, which are implemented as one or more non-transient machine or computer-readable or computer-usable storage media or mediums. Such computer-readable or computer usable storage medium or media is (are) considered to be part of an article (or article of manufacture). An article or article of manufacture can refer to any manufactured single component or multiple components. The non-transient machine or computer usable media or mediums as defined herein excludes signals, but such media or mediums may be capable of receiving and processing information from signals and/or other transient mediums.

Example embodiments of the material discussed in this specification can be implemented in whole or in part through network, computer, or data based devices and/or services. These may include cloud, internet, intranet, mobile, desktop, processor, look-up table, microcontroller, consumer equipment, infrastructure, or other enabling devices and services. As may be used herein and in the claims, the following non-exclusive definitions are provided.

In one example, one or more instructions or steps discussed herein are automated. The terms automated or automatically (and like variations thereof) mean controlled operation of an apparatus, system, and/or process using computers and/or mechanical/electrical devices without the necessity of human intervention, observation, effort and/or decision.

It will be appreciated that any components said to be coupled may be coupled or connected either directly or indirectly. In the case of indirect coupling, additional components may be located between the two components that are said to be coupled.

In this specification, example embodiments have been presented in terms of a selected set of details. However, a person of ordinary skill in the art would understand that many other example embodiments may be practiced which include a different selected set of these details. It is intended that the following claims cover all possible example embodiments.

The invention claimed is:

1. An integrated circuit comprising:
a plurality of on-chip-instrument-modules;
a test-controller-module configured to communicate data with the plurality of on-chip-instrument-modules;
a functional-module configured to communicate data with the plurality of on-chip-instrument-modules; and
an on-chip-instrument-controller configured to:
for each of the plurality of on-chip-instrument-modules, store an access-indicator; and
based on a value of the access-indicator for each on-chip-instrument-module, enable the on-chip-instrument-module to communicate with either:
the test-controller-module; or
the functional-module;
further comprising a test-interface-port configured to communicate data with the test-controller-module to set individual values of the access-indicator for each on-chip-instrument-module, wherein the on-chip-instrument-controller is configured to set a particular access-indicator value to enable communications between the test-controller-module and a particular on-chip-instrument-module in response to test-instructions received at the test-interface-port.

2. The integrated circuit of claim 1, wherein the on-chip-instrument-controller is configured to set the particular access-indicator value to enable communications between the functional-module and the particular on-chip-instrument-module in response to reset-instructions received at the test-interface-port.

3. The integrated circuit of any of claim 1, wherein the on-chip-instrument-controller is configured, by instructions received at the test-interface-port, to control the functional-module.

4. The integrated circuit of claim 3, wherein:
the functional-module is controlled to send instruction-data to one of the plurality of on-chip-instrument-modules; and
the on-chip-instrument-controller is configured to communicate built-in-self-test-data, representative of a response of the one of the plurality of on-chip-instrument-modules to the instruction-data, to the test-interface-port.

5. The integrated circuit of claim 1, wherein the on-chip-instrument-controller is configured at start-up to set the value of each access-indicator to enable communication between the functional-module and each on-chip-instrument-module.

6. The integrated circuit of claim 1, wherein the on-chip-instrument-controller comprises a transceiver and an instrument-data-register, and
wherein the transceiver is configured to communicate data between:
i) the test-controller-module and/or the functional-module; and
ii) the instrument-data-register; and
wherein the instrument-data-register is configured to communicate data with each of the plurality of on-chip-instrument-modules.

7. The integrated circuit of claim 6, wherein the transceiver comprises:
a serializer, configured to receive parallel-request-data from the functional-module and to provide serial-request-data, representative of the parallel-request-data, to one or more of the plurality of on-chip-instrument-modules; and
a deserializer, configured:
to receive serial-response-data from the one or more of the plurality of on-chip-instrument-modules in response to the serial-request-data; and
to provide parallel-response-data, representative of the serial-response-data, to the functional-module.

8. The integrated circuit of claim 6, wherein the instrument-data-register comprises:
a control-multiplexer; and
a control-deserializer, configured to receive serial-request-data from the test-controller-module and to communicate parallel-request-data, representative of the received serial-request-data, to the control-multiplexer, and
wherein the control-multiplexer is configured to multiplex parallel-request-data to an on-chip-instrument-module and from either:
i) the control-deserializer; or
ii) the functional-module
based on the value of the access-indicator for the on-chip-instrument-module.

9. The integrated circuit of claim 8, wherein the instrument-data-register further comprises:
an observe-multiplexer configured:
to receive parallel-response-data from the on-chip-instrument-module in response to the parallel-request-data; and
to multiplex the parallel-response-data to either:
i) the functional-module; or
ii) an observe-serializer, configured communicate serial-response-data, representative of the parallel-response-data, to the test-controller-module,
based on the value of the access-indicator for the on-chip-instrument-module.

10. The integrated circuit of claim 1, wherein one or more of the plurality of on-chip-instrument-modules comprises one or more of:
a signal sensor;
a signal generator; and
a signal processing module.

11. The integrated circuit of claim 1, wherein one or more of the plurality of on-chip-instrument-modules is configured to communicate with an external-component coupled to the integrated circuit.

12. The integrated circuit of claim 11, wherein the external-component is an antenna.

13. An automotive radio apparatus or an electronic device comprising the integrated circuit of claim 1.

* * * * *